(12) United States Patent
Pascucci

(10) Patent No.: US 6,501,700 B2
(45) Date of Patent: Dec. 31, 2002

(54) INTERNAL ADDRESSING STRUCTURE OF A SEMICONDUCTOR MEMORY

(75) Inventor: Luigi Pascucci, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/974,737

(22) Filed: Oct. 9, 2001

(65) Prior Publication Data
US 2002/0054537 A1 May 9, 2002

(30) Foreign Application Priority Data
Oct. 6, 2000 (EP) ............................................ 00830655

(51) Int. Cl.$^7$ ................................................ G11C 8/00
(52) U.S. Cl. .............................. 365/230.04; 365/230.03
(58) Field of Search ........................... 365/236, 230.03, 365/230.04, 230.05, 189.08

(56) References Cited

U.S. PATENT DOCUMENTS

| | | | |
|---|---|---|---|
| 5,027,319 A | 6/1991 | Lai ............................. | 365/156 |
| 5,371,877 A | 12/1994 | Drako et al. ................ | 395/425 |
| 5,710,904 A | 1/1998 | Masui ......................... | 395/405 |
| 5,787,047 A | * 7/1998 | Norris et al. .......... | 365/230.04 |

* cited by examiner

Primary Examiner—Richard Elms
Assistant Examiner—Hien Nguyen
(74) Attorney, Agent, or Firm—Lisa K. Jorgenson; Harold H. Bennett, II; Seed IP Law Group PLLC

(57) ABSTRACT

An internal addressing structure for a semiconductor memory with at least two memory banks, includes a counter associated for operation with each memory bank and capable of generating sequences of digital codes for addressing locations in the corresponding bank, a first circuit for causing a selective updating of the counters, a second circuit for loading into the counters a common initial digital code, forming part of an initial address supplied to the memory from the outside through an addressing line bus, corresponding to an initial memory location, and a third circuit capable of detecting a first signal, supplied to the memory from the outside and indicating the presence of a digital code on the bus, to cause the common initial digital code to be loaded into the counters. The first circuit is capable of identifying, on the basis of the initial address, the bank to which the initial memory location belongs, and of consequently causing the periodic updating of the counters in a sequence which depends on the bank to which the initial memory location belongs, in such a way that successive memory locations preceding or following the initial location are addressed in sequence, each of these successive locations belonging to a corresponding memory bank, according to an interlaced system.

25 Claims, 8 Drawing Sheets

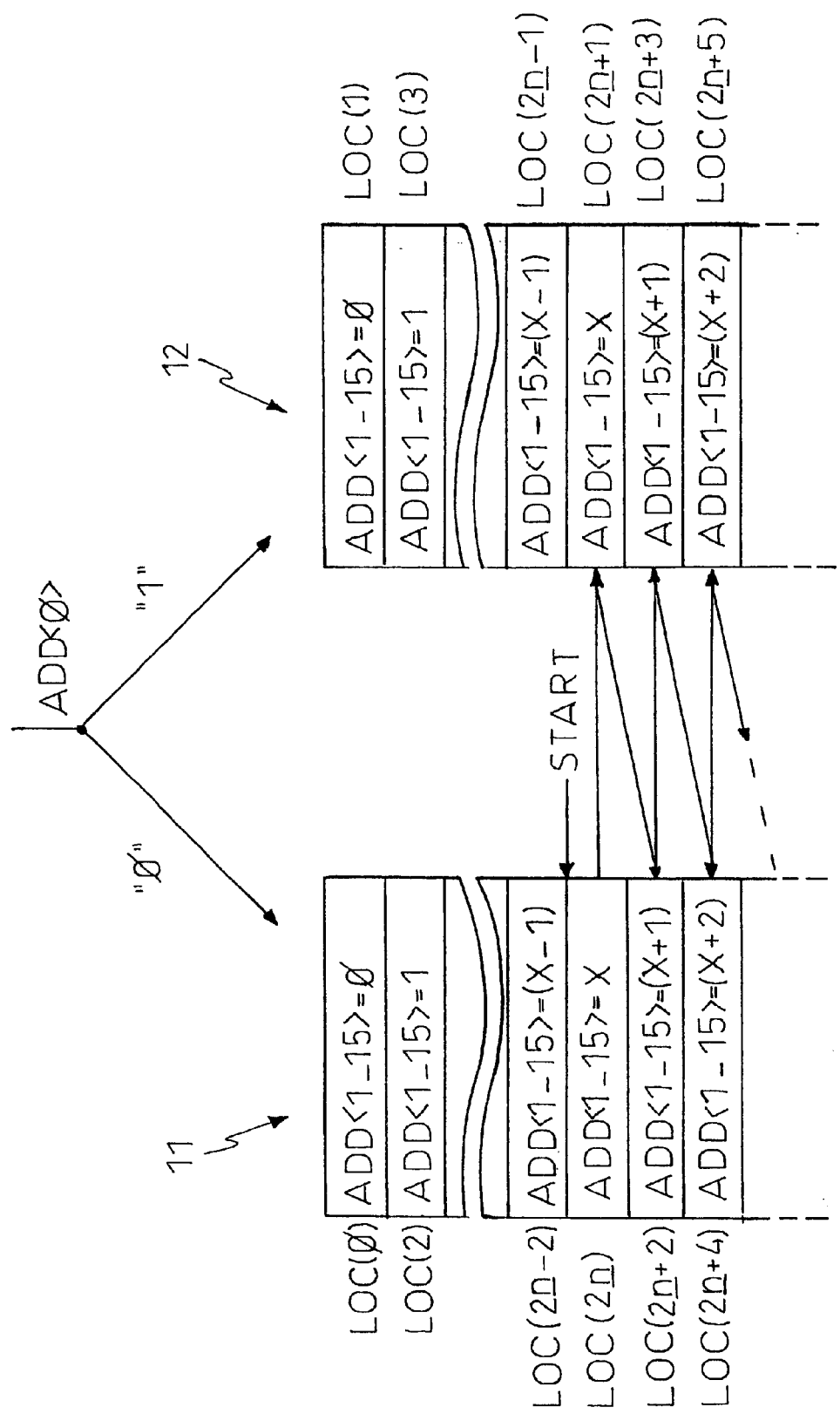

INTERNAL ADDRESSING STRUCTURE OF A SEMICONDUCTOR MEMORY

BACKGROUND OF THE INVENTION

1. Field of the Invention

The present invention relates to the field of semiconductor memories, and particularly but not exclusively to non-volatile memories, such as flash EEPROM memories (referred to hereafter as "flash memories").

2. Description of the Related Art

The typical structure of the simplest non-volatile semiconductor memories such as ROMs and EPROMs essentially comprises a matrix of memory cells (memory matrix) with the cells arranged in rows (word lines) and columns (bit lines), circuits for decoding an externally supplied address, circuits for selecting the memory cells within the matrix according to the externally supplied address, circuits for reading the contents of the selected memory cells, and output circuits for driving external data lines.

In a conventional non-volatile memory, the only form of reading access to the memory is random access. The address of a memory location whose content is to be read is supplied to the memory from the outside. Access to the memory is random because the memory cannot predict which memory location is to be accessed before the address of the location has been supplied to it from the outside. The decoding circuits and the selection circuits are responsible, respectively, for decoding the externally supplied address and for the selection of the memory cells which correspond to this address, in other words the selection of the rows and columns of the matrix. The reading circuits read the contents of the selected memory cells and supply the result of the reading to the output circuits; the data element read at the addressed memory location is sent to the data lines external to the memory.

In a memory access of this type, the time required to complete the reading (called the memory access time) is the total of a plurality of component times, representing the duration of the various elementary steps which make up the process of access to and extraction of the data element. These elementary steps comprise the propagation of the signals along the row and column selection paths, the activities of precharging, of the selected columns for example, the reading and evaluation of the data stored in the selected memory cells, the propagation and the transfer of the read data to the output circuits ("buffers"), and the switching of these.

Each read access operation of the random type requires the execution of all the aforesaid elementary steps. Consequently, the access time is rather long, and it is always difficult to reduce it, even if advanced manufacturing technologies are used. In particular, the memory access time in random reading is longer than the time required simply to read the content of a location in the memory.

More advanced memories, such as flash memories, have a more complex structure and can be organized in such a way that the memory matrix is divided into two or more memory banks which are essentially independent. In flash memories, providing two or more memory banks permits a specificity of the erase operation, which, instead of always involving the whole of the memory, can involve only the cells of one memory bank.

In these memories it is possible to provide counters of various sizes, for carrying out functions which are of different kinds, but which generally all relate to the control of the activities of modifying the content of the memory cells (the "modify" operation) and of verifying this content (the "verify" operation) after a modify operation. These functions can comprise, for example, the internal addressing of the memory matrix, the definition of the programming times for the memory cells whose content is to be modified, the counting of the memory cell programming attempts, etc. However, the counters operate in an entirely autonomous way, without coordination between them, each one carrying out the specific function assigned to it.

BRIEF SUMMARY OF THE INVENTION

In view of the prior art which has been described, an embodiment of the present invention provides an internal addressing structure for a memory, which enables functionality additional to that of known memories to be implemented in the memory.

According to an embodiment of the present invention, the internal addressing structure for a semiconductor memory includes at least two memory banks; a corresponding counter associated for operation with each memory bank and capable of generating sequences of digital codes for addressing locations of the corresponding bank; a first circuit for selectively updating the counters; a second circuit for loading into the counters a common initial digital code corresponding to an initial memory location; anda third circuit capable of detecting a signal, supplied to the memory from the outside and indicating the presence of a digital code on an address line bus, to cause the common initial digital code to be loaded into the counters.

The first circuit means is capable of identifying, on the basis of the initial address, the bank to which the initial memory location belongs, and of consequently causing the periodic updating of the counters in a sequence which depends on the bank to which the initial memory location belongs, in such a way that successive memory locations preceding or following the initial location are addressed in sequence, each of these successive locations belonging to a corresponding memory bank, according to an interlaced system.

Another embodiment provides a method of operation of a device according to the principles of the invention.

BRIEF DESCRIPTION OF THE SEVERAL VIEWS OF THE DRAWINGS

The characteristics and advantages of the present invention will be made clearer by the following detailed description of a possible practical embodiment of the invention, illustrated purely by way of example and without restrictive intent in the attached drawings, in which:

FIGS. 6A and 6B illustrate, in a simplified way, the operation of the memory according to the invention.

DETAILED DESCRIPTION OF THE INVENTION

Figure 1:
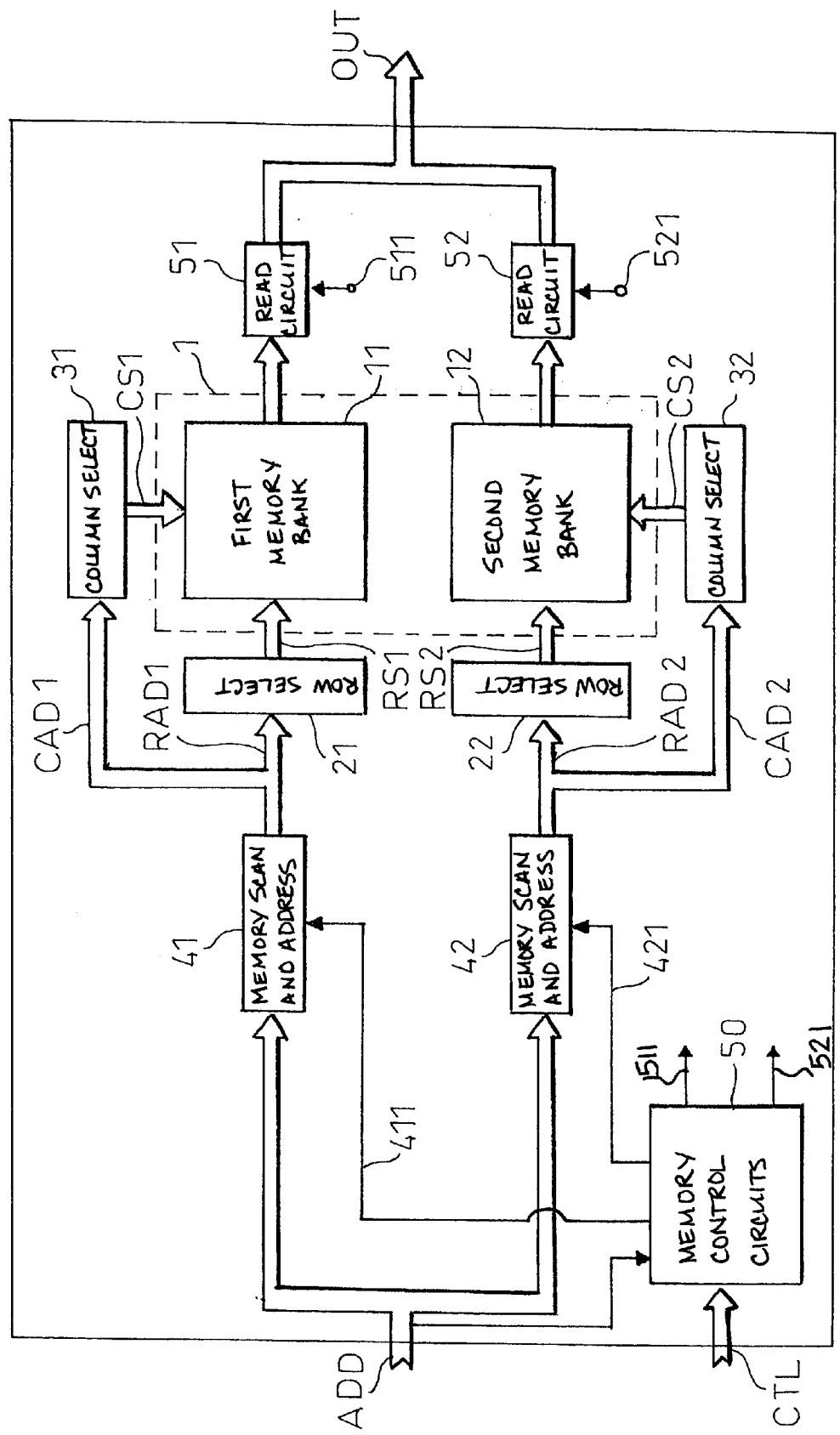
FIG. 1 is a simplified schematic block diagram of a memory according to the present invention.

With reference to the drawings, and in particular to FIG. 1, this shows a simplified schematic block diagram of a memory according to the present invention. The memory, a flash memory for example, comprises a memory matrix 1, divided into two essentially independent memory banks 11, 12, in which the memory cells are arranged in a known way in rows (word lines) and columns (bit lines). The memory comprises, for each memory bank 11, 12, a corresponding circuit 21, 22 for decoding row addressing and row selection signals, which generates corresponding row selection signals RS1, RS2, and a corresponding circuit 31, 32 for decoding column addressing and column selection signals, which generates corresponding column selection signals CS1, CS2. The circuits 21 and 31 associated with the memory bank 11 receive row addressing signals RAD1 and column addressing signals CAD1 respectively, from a first scanning circuit 41 capable of carrying out a sequential scan of the memory locations of the memory bank 11. In the same way, the circuits 22 and 32 associated with the memory bank 12 receive row addressing signals RAD2 and column addressing signals CAD2 respectively from a second scanning circuit 42 capable of carrying out a sequential scan of the memory locations of the memory bank 12. The two scanning circuits 41, 42 receive, in parallel, address signals supplied from the outside through an address signal bus ADD external to the memory, for addressing the memory locations of the memory. The two memory banks 11, 12 are associated with corresponding reading circuits 51, 52 for reading the contents of the selected memory cells in the first and second memory bank respectively. For simplicity of representation, it is assumed that the reading circuits 51, 52 also incorporate output buffer circuits normally provided to place the contents of the read memory location on data bus lines OUT external to the memory.

FIG. 1 also shows a block 50 which is understood to incorporate memory control circuits; the block 50 receives, from the outside, memory control signals CTL and at least one of the signals from the ADD bus. The block 50 supplies control signals 411, 421 to the scanning circuits 41, 42 and control signals 511, 521 to the reading circuits 51, 52.

Figure 2:
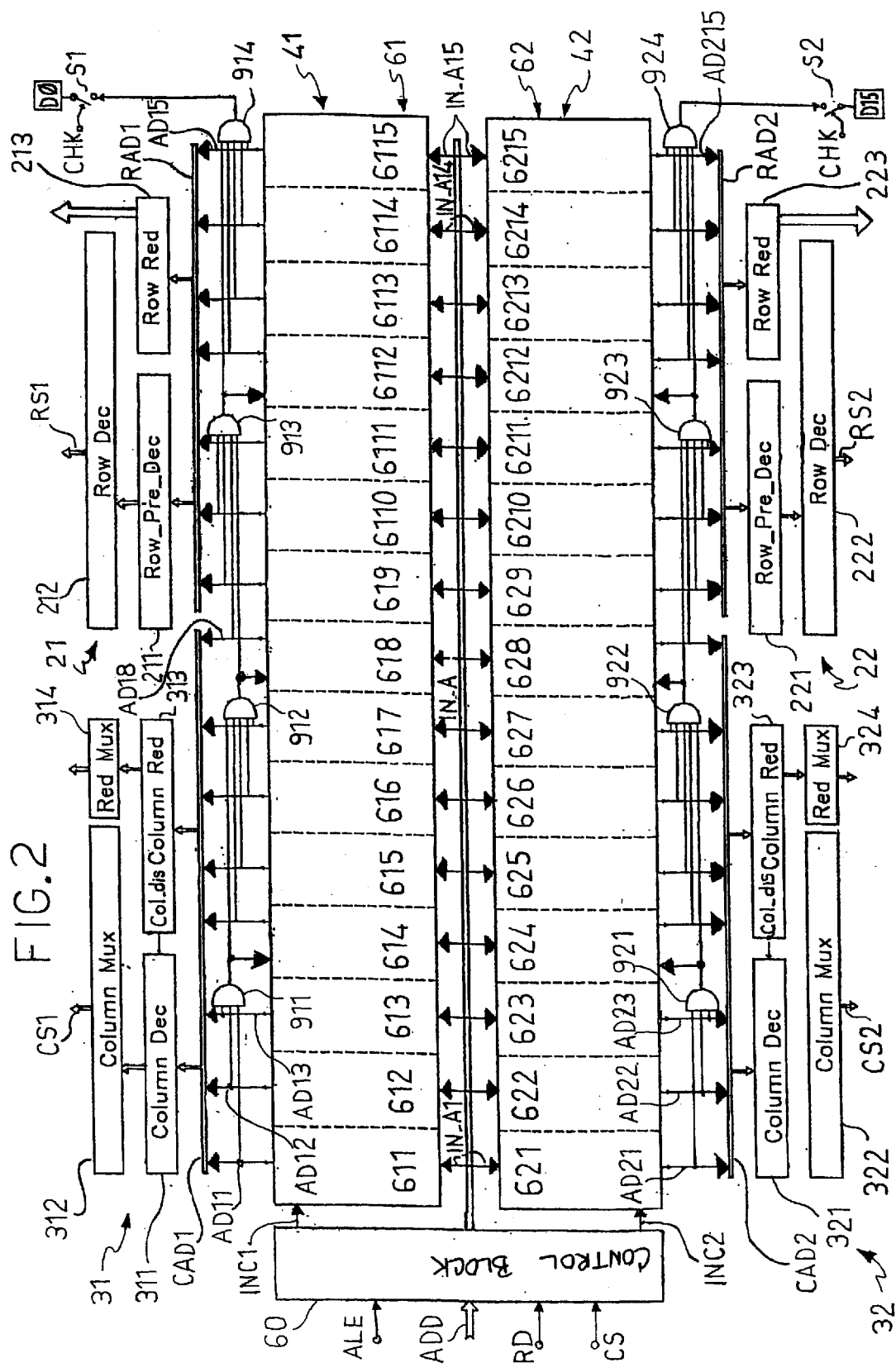
FIG. 2 is a more detailed schematic diagram of some blocks of the memory of FIG. 1.

With reference now to FIG. 2, which shows a possible embodiment of the invention, each of the two scanning circuits 41, 42 comprises a respective counter 61, 62, in this example a binary counter of the "ripple" type with fifteen stages 611–6115 and 621–6215 respectively. Each stage 611–6115 and 621–6215 of each of the two counters 61, 62 receives at its input a corresponding signal IN_A1–IN_A15 from an addressing signals bus IN_A within the memory 11. Outputs AD11–AD18 of the stages 611–618 of the counter 61 form the set of column addresses CAD1, and outputs AD19–AD115 of the stages 619–6115 form the set of row addresses RAD1 for the first memory bank. In the same way, outputs AD21–AD28 of the stages 621–628 of the counter 62 form the set of column addresses CAD2, and outputs AD29–AD215 of the stages 629–6215 form the set of row addresses RAD2 for the second memory bank 12.

As shown schematically in FIG. 2, each of the circuits 21, 22 comprises a pre-decoding circuit 211, 221 which receives the outputs AD19–AD115, AD29–AD215 of the stages 619–6115, 629–6215 of the counter 61, 62, and which carries out a first level of decoding of the row addressing signals. The pre-decoding circuit 211, 221 supplies a second-level decoding and row selection circuit 212, 222, which carries out a second level of decoding and selects the rows of the corresponding memory bank. Each circuit 21, 22 also preferably comprises a corresponding row redundancy circuit 213, 223, which receives the outputs AD19–AD115, AD29–AD215 of the stages 619–6115, 629–6215 of the counter 61, 62, to carry out a comparison of a row address carried by these outputs with defective row addresses stored in the circuit and, if the outcome of the comparison is positive, selects a redundant row which will be substituted for the defective addressed row for functional purposes.

In the same way, each of the circuits 31, 32 comprises a decoding circuit 311, 321 which receives the outputs AD11–AD18, AD21–AD28 of the stages 611–618, 621–628 of the counter 61, 62 and decodes them, and a selection circuit (multiplexing circuit) 312, 322 supplied by the circuit 311, 321 which selects the column(s) of the memory bank. Each circuit 31, 32 also comprises a corresponding column redundancy circuit 313, 323, which receives the outputs AD11–AD18, AD21–AD28 of the stages 611–618, 621–628 of the counters 61, 62, and which makes a comparison between a column address carried by these outputs and defective column addresses stored in the circuit, and, if the outcome of the comparison is positive, disables the circuit 31, 32 and, by means of a redundant column selection circuit 314, 324, selects a redundant column for substitution for functional purposes.

The two counters 61, 62 form the basic circuit blocks for addressing the respective memory banks 11, 12, by supplying, among others, the stimulus signals for the decoding and selection circuits for the rows 21, 22 and for the columns 31, 32, and also for the circuits, if provided, for recognizing addresses relating to defective rows and/or columns and for consequent selection of redundant rows and/or columns to be substituted.

Preferably, as shown in FIG. 2, each counter 61, 62 is associated with a corresponding network for calculation and propagation of the amount carried over (the "carry" operation). This network comprises four AND gates 911–914, 921–924. The outputs AD11–AD13, AD21–AD23 of the three stages 611–613, 621–623 are set to a logical AND by the gate 911, 921. The output of the AND gate 911, 921 is supplied to a carry input of the stage 614, 624. The output of the AND gate 911, 921 is also set to a logical AND with the outputs of the stages 614–617, 624–627 of the AND gate 912, 922. The output of the AND gate 912, 922 is supplied to a carry input of the stage 618, 628. The output of the AND gate 912, 922 is reset to a logical AND with the outputs of the stages 618–6111, 628–6211 by the AND gate 913, 923. The output of the AND gate 913, 923 is supplied to a carry input of the stage 6112, 6212. Finally, the output of the AND gate 913, 923 is set to a logical AND with the outputs of the stages 6112–6115, 6212–6215 by the AND gate 914, 924. The output of the AND gate 914, 924 is made available, by means of a switch S1, S2 respectively, which can be operated selectively by a control signal CHK, on a terminal D0, D15 accessible from the outside of the memory.

Between the stages 611–613, 614–617, 618–6111 and 6112–6115 of the first counter 61, and also between the stages 621–623, 624–627, 628–6211 and 6212–6215 of the second counter 62, the propagation of the carry follows the usual "ripple" procedure of a counter: a carry-out output of one stage is supplied to a carry input of the stage following it.

Therefore, the stages of each counter are ideally grouped into groups of stages. The propagation of the carry is of the conventional "ripple" type between the stages of a single group, while the described network for calculating the carry propagates the carry between different groups of stages.

Thus the propagation path of the carry is shortened overall by comparison with a conventional solution which is based solely on a simple propagation of the "ripple" type, and the counters become faster.

Moreover, it should be noted that, owing to the particular grouping of the stages of the counter, the output of the AND gate 912, 922 indicates the fact that a scan of the columns of the memory bank 11, 12 has been completed, while the output of the AND gate 914, 924 indicates the fact that a scan of the rows has been completed. This can be advantageously exploited for the generation of internal timing signals of the memory.

Yet another advantage is that, by making the output of the carry calculation network available on an externally accessible terminal D0, D15 of the memory, it is possible to monitor the counters 61, 62, for example in order to verify the correctness of the counting, or the total carry propagation time. For this purpose, it is simply necessary to provide a monitoring procedure, which causes the signal CHK to be activated in such a way that the output of the AND gate 914, 924 is connected electrically to the externally accessible terminal D0, D15 respectively. The terminal D0, D15 can, for example, be a terminal of the memory to which a data line of the OUT bus is normally connected during operation.

The monitoring of the counters, made possible by the presence of the carry calculation network and by the possibility of making the output of the AND gate 914, 924 outside the memory, enables the total periods of monitoring of the memory to be reduced if there is a fault in the counters. This is because the monitoring of the counters can advantageously be carried out before the final stages of monitoring which require the programming of particular data patterns in the cells.

FIG. 2 also shows schematically a control block 60, particularly one for controlling the counters 61, 62. The block 60 receives the address signals ADD from outside the memory, and supplies at its output, in addition to the internal address signal bus IN_AD, two selective incrementing signals INC1, INC2 for the counters 61, 62.

The block 60 also receives, again from outside the memory, signals ALE, RD and CS, forming part of the set of control signals indicated in a general way by CTL in FIG. 1. The three signals ALE, RD and CS, the meaning of which is explained more fully below, are controlled by a logic of an electronic system, for example a microprocessor, by which the memory is controlled. The signal CS ("Chip Select") is a signal for enabling, or switching on, the memory. The signal RD is a signal which controls the operations of reading from the memory. The signal ALE is a signal which is set by the microprocessor when a new valid address has been sent to the addressing signal bus ADD.

Figure 3:
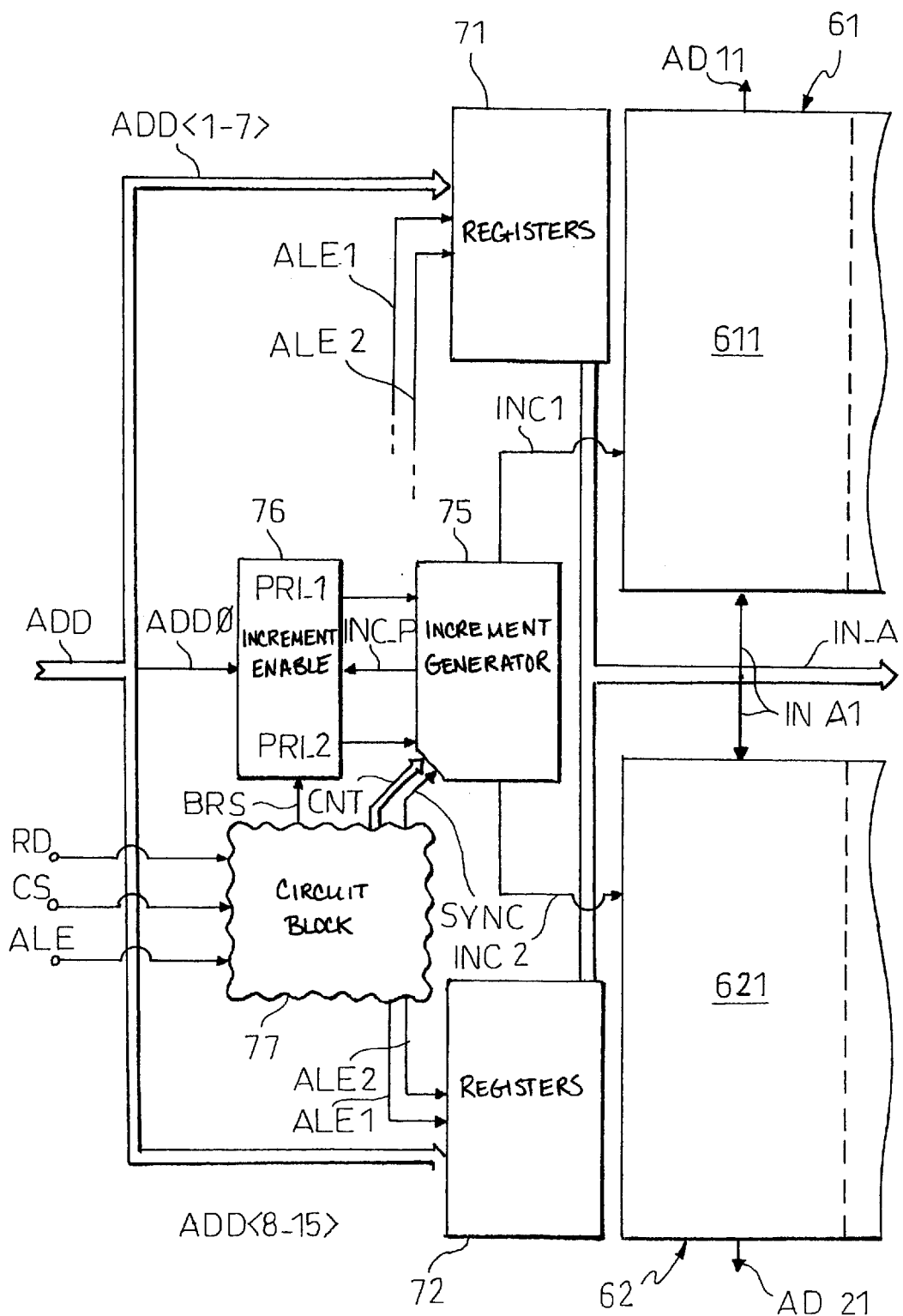
FIG. 3 is a schematic diagram of the structure of a control block shown in FIG. 2.

The block 60 is shown in greater detail, but still in the form of a functional block diagram, in FIG. 3. In particular, the block 60 comprises a circuit block 77, which comprises circuits for generating internal control signals for controlling the operation of the memory, including internal timing signals of the memory. The block 60 also comprises a first and a second block 71, 72, each of which includes, in addition to corresponding input buffer circuits, a corresponding bank of registers. The banks of registers of the blocks 71, 72 receive, respectively, a first and a second subset ADD<1–7>, ADD<8–15> of the external address signals ADD. Each of the two banks of registers of the blocks 71, 72 is capable of storing a current address carried by a respective subset ADD<1–7>, ADD<8–15> of the external address signals ADD. The outputs of the two blocks 71, 72 form the internal addressing signal bus IN_A which supplies the two counters 61, 62. The operation of the blocks 71, 72 is controlled by a pair of signals ALE1, ALE2 generated by the block 77 from the external signal ALE. As will be more fully understood from the following description, the signal ALE1 is essentially a delayed copy of the signal ALE, while the signal ALE2 is essentially a delayed copy of the signal ALE extended in time.

A block 75, which receives control signals CNT and a synchronization signal SYNC from the block 77, generates corresponding incrementing signals INC1, INC2 to increment the counters 61, 62 respectively. The incrementing signals INC1, INC2 are subject to the action of enabling signals PRI_1, PRI_2 generated by a block 76. The enabling signals PRI_1, PRI_2 enable the alternative incrementing of one or the other of the two counters 61, 62. The block 76 receives from the block 75 a signal INC-P, which supplies a timing signal to the block 76. The block 76 also receives from block 77 a signal BURST, which causes the memory locations to enter a sequential reading ("burst reading") mode. The block 76 also receives from the addressing signal bus ADD the address signal ADD<0>, which is used by the memory to carry out the selection of one or other of the two memory banks 11, 12.

Figure 4:
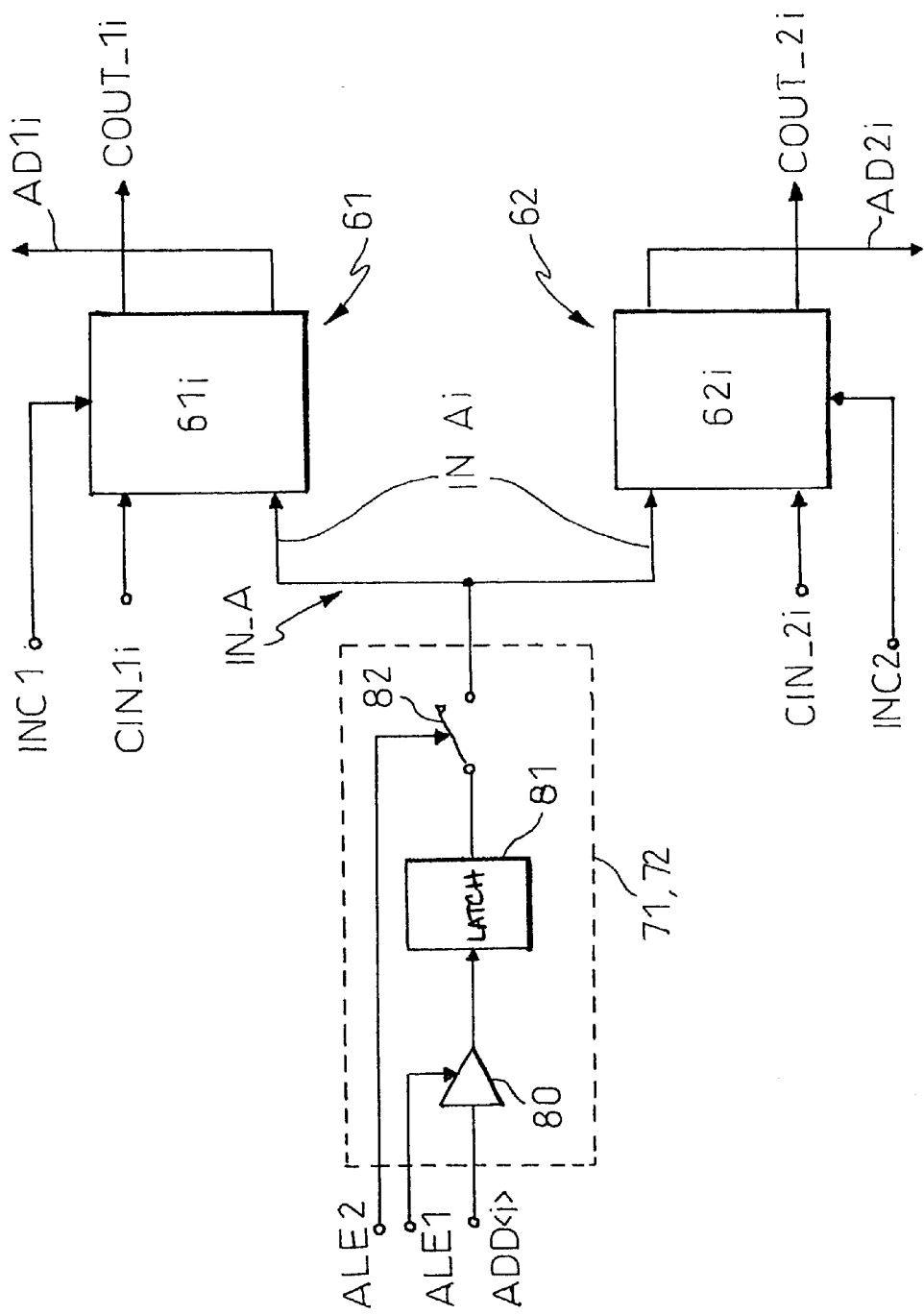
FIG. 4 is a schematic diagram of the structure of two blocks making up the control block of FIG. 2.

FIG. 4 shows a simplified schematic diagram of the blocks 71, 72. For each signal ADD<i>, where i=1, . . . , 15, of the external address signal bus ADD, a corresponding input buffer 80 of the three-state type, in other words one that can be selectively enabled by means of the signal ALE1, is provided; the output of the buffer 80 supplies a bistable ("latch") circuit 81. The output of the latch 81 can be connected, by means of a switch 82 operated by the signal ALE2, to a corresponding line IN_Ai of the internal address bus IN_A. The same figure also shows generic stages $61i$, $62i$ of the counters 61, 62, which receive the signal IN_Ai from the internal address bus IN_A. Each stage $61i$, $62i$ has a carry input which receives a corresponding carry signal CIN_1i, CIN_2i from the preceding stage of the counter, or, for stages 614 and 624, 618 and 628, 6112 and 6212, from the output of the AND gate 911 and 921, 912 and 922, 913 and 923, 914 and 924, respectively, shown in FIG. 2. Each stage $61i$, $62i$ supplies at its output a corresponding signal AD1i, AD2i to be supplied to the row decoding and selection circuits 21, 22 and the column decoding and selection circuits 31, 32 of the memory bank 11, 12 respectively. Each stage $61i$, $62i$ also supplies at its output a corresponding carry signal COUT_1i, COUT_2i for the following stages of the counter 61, 62.

Figure 5:
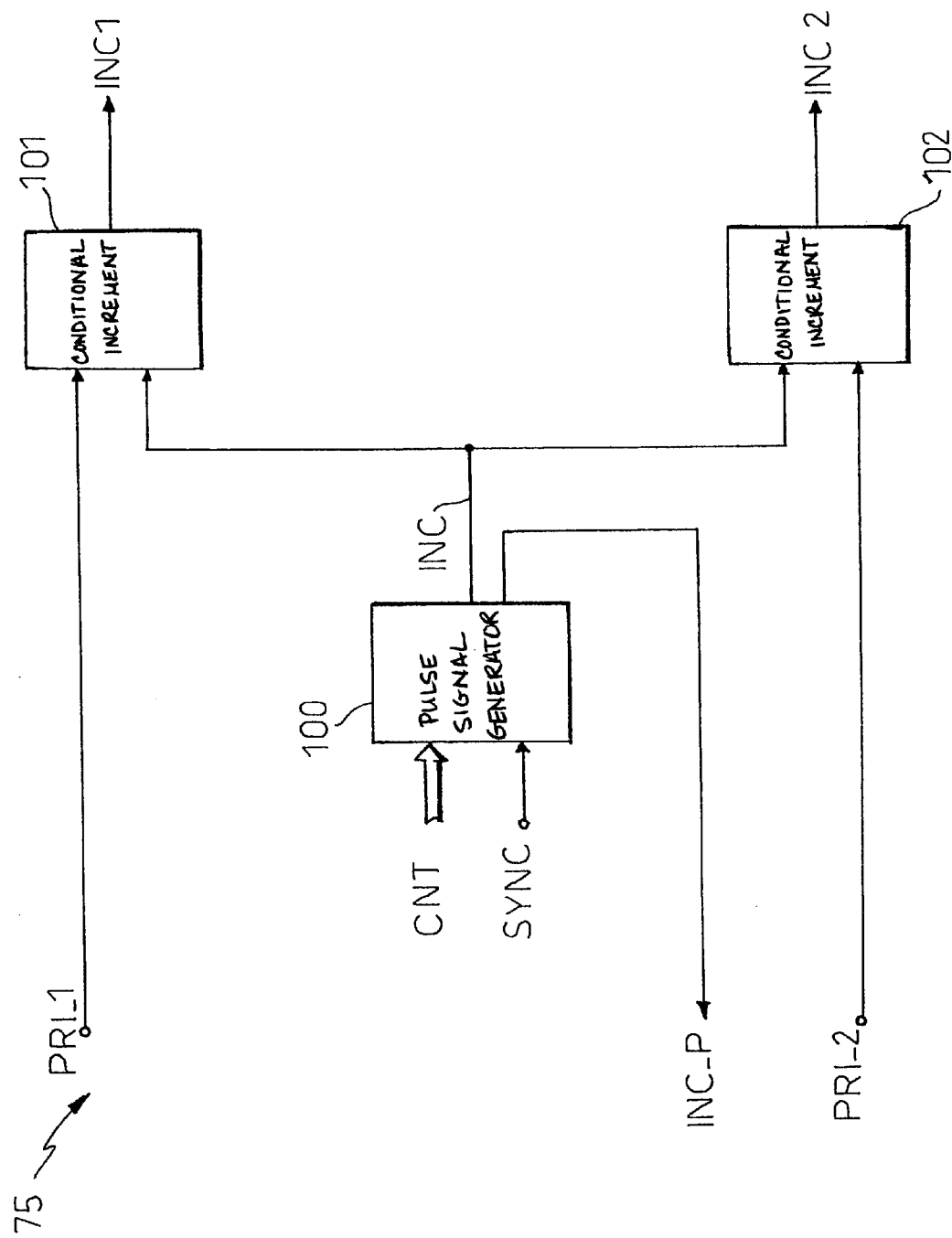
FIG. 5 is a schematic diagram of a further block making up the control block of FIG. 2.

FIG. 5 shows a schematic, but more detailed, diagram of the block 75 of FIG. 3. The block 75 comprises a circuit 100 which, under the control of the synchronization signal SYNC and the control signals CNT supplied by the block 77, generates a pulsed signal INC. The signal INC is supplied to a pair of conditional incrementing circuits 101, 102, which receive the signal PRI_1 and PRI_2 respectively from the block 76. The circuits 101, 102 generate the incrementing signals INC1, INC2 which increment the counters 61, 62 respectively. The circuit 100 also generates the signal INC_P which is supplied to the block 76.

The memory described above operates in the following way.

In operation, the memory forms part of a more complex electronic system, typically comprising a control logic by which the memory is controlled, for example a microprocessor. The signals CS, RD and ALE are controlled by the microprocessor. In particular, the signal ALE ("Address Latch Enable") is activated by the microprocessor after the latter has sent to the addressing signal bus ADD an address of a new memory location whose content is to be read.

The memory is capable of carrying out a sequential ("burst") reading; the term "sequential reading" is used here to denote a reading mode which is different from random-access reading, and in which, after an address of an initial memory location, in other words a memory location from which the reading process is to start, has been supplied from the outside, the memory is capable of supplying at its output the content of the memory locations following the initial location in an autonomous way, without having to wait for the addresses of these following memory locations to be supplied from the outside.

In other words, and with reference to FIG. 6A, assuming that the initial address corresponding to the memory location LOC(2n) is supplied to the memory from the outside, the memory is capable of supplying at its output the content of the location LOC(2n) and subsequently, in sequence, the content of the locations LOC(2n+1), LOC(2n+2), etc., in an uninterrupted way until the microprocessor interrupts the sequential reading.

Advantageously, as a result of the described architecture, the execution of sequential reading by the memory proceeds in an interleaved mode, by sequential accessing of consecutive locations in the space of the memory addresses, these locations belonging alternatively to one or other of the two memory banks. All this is done in a way which is totally transparent to the external system.

In particular, after the microprocessor has sent to the external addressing bus ADD a new address corresponding to the initial memory location of the sequential reading, and has set the signal ALE to indicate to the memory that a new valid address is present on the ADD bus, the memory proceeds in the following way.

The new address present on the ADD bus is loaded into both counters 61, 62. More specifically, the configuration present in the signals ADD<1–15> of the ADD bus is loaded into the two counters. On the other hand, the signal ADD<0> is used by the memory to determine which of the two memory banks 11, 12 contains the memory location initially addressed by the microprocessor, this being the initial memory location.

In other words, the signal ADD<0> on the ADD bus determines the selection of one or other of the two memory banks 11, 12. This selection takes place only at the start of a sequential reading operation, when the signal ALE is set, after which the memory becomes insensitive to the status of the external addressing signals ADD.

With reference to FIG. 6A, it will now be assumed, for the sake of clarity, that the memory bank 11 contains the memory locations LOC(2n), where n is an integer, with even-numbered addresses (in other words those locations i for all of whose addresses ADD<0>="0"), and the memory bank 12 contains the memory locations LOC(2n+1) with odd-numbered addresses (for which ADD<0>="1"). It is also assumed that the initial address set by the microprocessor on the ADD bus is an even-numbered address, in other words that ADD<0>="0"; this address corresponds to a memory location LOC(2n) belonging to the memory bank 11 of the locations with even-numbered addresses. Clearly, each individual combination of the signals ADD<1>–ADD<15> identifies two memory locations, one belonging to the bank 11 and the other belonging to the bank 12; the signal ADD<0>, however, identifies the memory bank: ADD<0>="0"→ memory bank 11, ADD<0>="1"→ memory bank 12.

After the address ADD<1–15>=x of the initial location has been loaded into both counters, the memory reads the content of the initially addressed memory location LOC(2n); for this purpose, the row decoding and selection circuits 21 and column decoding and selection circuits 31 associated with the memory bank 11, which receive from the counter 61 the address of the memory location to be read, carry out the selection of the location; the reading circuits 51 read the content of the location, and place the read data element on the OUT bus.

On completion of the reading of the initial location LOC(2n), the memory autonomously reads the following memory locations in sequence, moving alternately from one memory bank to the other.

In particular, after the reading of the location LOC(2n) has been carried out, the memory increments by one the content of the counter 61, which will therefore contain the address ADD<1–15>=(x+1) of the location which, in the bank 11, immediately follows the initial location, and which corresponds to the location LOC(2n+2).

At the same time, the memory starts the reading of the location ADD<115>=x of the bank 12, corresponding to the location LOC(2n+1) which has an odd-numbered address and immediately follows the previously read location in the address space. The address of this location is already contained in the counter 62, since the location LOC(2n+1) shares the part ADD<1>–ADD<15> of the address signals ADD with the initial location. For this purpose, the row decoding and selection circuit 22 and the column decoding and selection circuit 32 associated with the memory bank 12, which receive the address of the new location to be read from the counter 62, select the location; the reading circuits 52 read the content of the location LOC(2n+1) and send the read data to the OUT data bus.

Similarly, after the reading of the location LOC(2n+1) has been completed, the memory increments by one the content of the counter 62, which will then contain the address ADD<1 15>=(x+1) of the location immediately following the location LOC(2n+1) which has just been read in the bank 12, corresponding to the location LOC(2n+3). At the same time, the memory starts the reading of the location LOC (2n+2) of the bank 11, whose address is already contained in the counter 61.

Figure 6B:
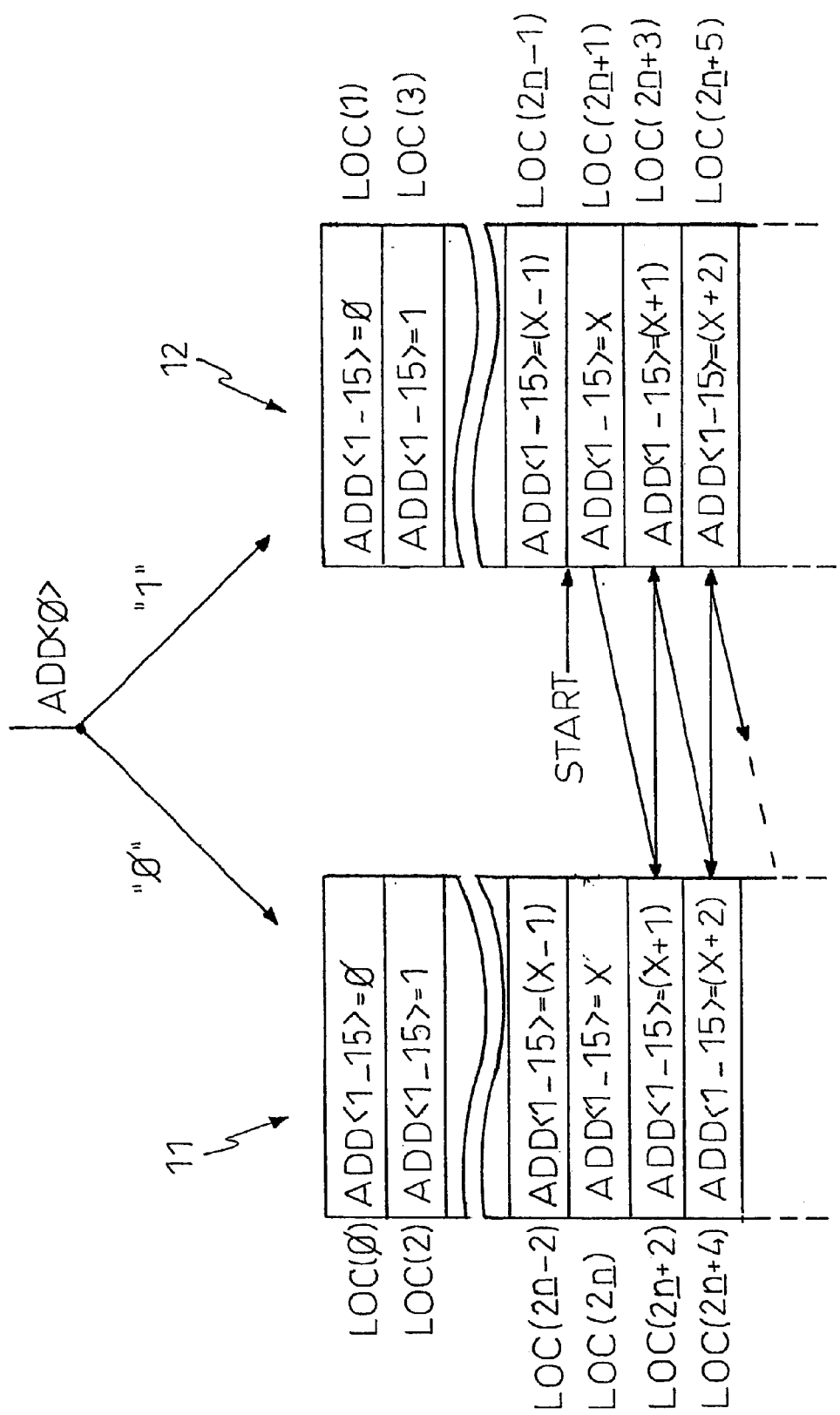

In the absence of a stop command from the microprocessor, the memory proceeds indefinitely in this way, scanning the whole of the memory address space, alternating between reading operations the memory bank in which the reading is to be carried out. The content of the counter associated with the memory bank containing the memory location which has just been read is immediately incremented on completion of the reading. The memory proceeds in this mode of autonomous sequential interlaced reading of the two memory banks, until the microprocessor sets the signal ALE again, thus indicating to the memory that a new address of a location to be read has been sent to the external addressing bus ADD FIG. 6B is similar to FIG. 6A, but relates to the case in which the initial location LOC(2n+1) has an odd-numbered address, in other words ADD<0>="1". In this case, after the address ADD<1–15>=x of the initial location has been loaded into both counters 61, 62, the memory ascertains by means of the block 76 that the location in question is odd-numbered, and immediately increments by one the content of the counter 61 associated with the bank 11 of the locations having odd-numbered addresses, which will contain the address ADD<1–15>=(x+1). At the same time, the memory reads the content of the initial location LOC(2n+1). After the reading of the initial location LOC(2n+1) has been carried out, the memory increments by one the content of the counter 62, which will therefore contain the address ADD<1–15>=(x+1) of the location which, in the bank 12, immediately follows the initial location, and which corresponds to the location LOC(2n+3). At the same time, the memory starts the reading of the location ADD<1–15>=(x+1) of the bank 11, corresponding to the location LOC(2n+2) which has an even-numbered address and immediately follows the previously read location in the address space. The reading then continues in a way similar to that which was described previously, without interruption, until the microprocessor causes it to stop.

Figure 7:
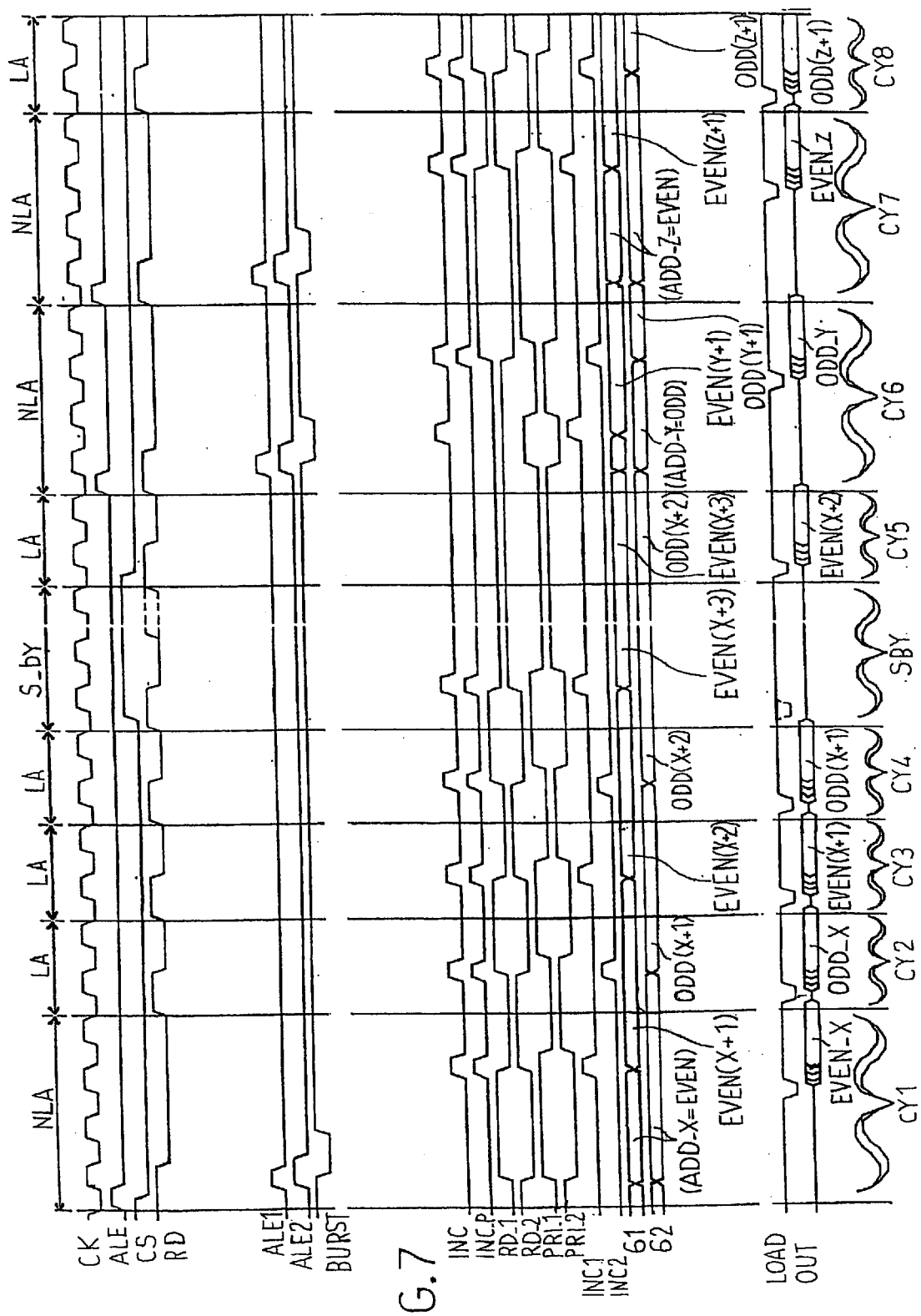
FIG. 7 shows the variation in time of the most significant signals in the operation of the memory.

FIG. 7 is a diagram showing the variation in time of some signals which are significant for an understanding of the operation of the memory. In addition to the aforementioned external signals ALE, CS and RD, the diagram shows a signal CK which represents a timing signal of the microprocessor.

FIG. 7 shows reading cycles CY1–CY8, and an interval of time SBY ("stand-by") in which the memory is disabled. The cycles CY1, CY6 and CY7 are normal reading cycles, with the addresses supplied to the memory from the outside. The cycles CY2, CY3, CY4 and CY8 are sequential reading cycles.

Starting from the cycle CY1, after a new address with the value ADD<1–15>=ADD_x has been sent to the ADD bus, and ADD<0>="0" (even-numbered address), the microprocessor sets the signal ALE The microprocessor then enables the memory by changing the signal CS to the low logical level. The microprocessor then sets the signal RD, changing it to a low logical level. In response to the setting of the signal ALE, the memory sets the signals ALE1 and ALE2, which cause the address ADD_x to be loaded into the counters 61, 62. The memory then switches the signal BURST to the low logical level, keeping it at this level for a predetermined period, and then returns the signal BURST to the high logical level.

The memory starts reading from the location EVEN_x with the address ADD_x in the memory bank 11, setting a signal enabling the reading of the bank 11 (signal RD_1) and disabling, by means of a signal enabling the reading of the bank 12 (RD_2), the reading of the location ODD_x having the even-numbered address ADD_x in the bank 12.

When the reading of the location EVEN_x has been completed, a LOAD signal generated inside the memory (forming part of the group of signals indicated in a general way by 511, 512 in FIG. 1) causes the content of the location EVEN_x which has been read to be sent to the external data bus OUT, so that it can be read by the microprocessor.

When it recognizes from the signal ADD<0> that the currently addressed location is even-numbered, the circuit 76 sets the signal PRI_1, which therefore enables the generation of a pulse on the signal INC1 for incrementing by one the content of the counter 61, which will then contain the address ADD_(x+1) of the even-numbered memory location EVEN_(x+1) following the initial location EVEN_x.

In the next cycle CY2, the signal ALE is not set by the microprocessor, which simply sets the signal RD. In the preceding cycle CY1, the memory, after completing the reading of the initial location EVEN_x belonging to the bank 11, has already started the reading of the memory location ODD_x having the address ADD_x but belonging to the memory bank 12 (setting of the signal RD_2). The switching of the signal RD to "1" starts the cycle CY2, informing the memory that the microprocessor has read the content of the location EVEN_x present on the OUT data bus, and is ready to receive the content read from the new location ODD_x. Therefore, when the reading of the location ODD_x has been completed, the signal LOAD is set and the memory sends the content of the location ODD_x to the OUT bus. After the reading of the odd-numbered location with the address ADD_x has been completed, the memory starts (setting of the signal RD_1) the reading of the even-numbered location EVEN_(x+1) having the address ADD_(x+1). At the same time, the circuit 76 enables (signal PRI_2) the incrementing by one of the content of the counter 62 (signal INC2).

The memory proceeds in a similar way in the following cycles CY3 and CY4, in which the microprocessor does not set the signal ALE, but simply cycles the signal RD.

It is assumed that, after the completion of the cycle CY4, and after the microprocessor has again set the signal RD, the signal CS is switched to the high logical level; in other words the memory is disabled: the "stand-by" state is entered. Although the memory has already completed the reading of the location EVEN_(x+2) having the address ADD_(x+2), belonging to the memory bank 11, it cannot supply the content of this location to the OUT data bus. Therefore, to prevent the loss of the completed reading, on restarting (cycle CY5) from the stand-by state, when the signal CS is again switched to the low logical level, thus enabling the memory, the latter sends the content of the location EVEN_(x+2), read previously in the course of the cycle, to the OUT data bus. If the microprocessor does not set the signal ALE, the memory is able to continue with the sequential reading on return from the stand-by state.

If the microprocessor sends a new address, for example an address ADD<1–15>=ADD_y and ADD<0>="1", corresponding to an odd-numbered location, to the address bus ADD after the cycle CY5, and sets the signal ALE, the memory interrupts the sequential mode, loads the address ADD_y of the location into the two counters 61, 62, and proceeds with the reading of this location, from the memory bank 12 specified by ADD<0>. The cycles CY6 and CY7 both relate to a reading of memory locations whose addresses are supplied externally by the microprocessor. If the microprocessor does not set the signal ALE in the cycle following the cycle CY7, the memory returns to the sequential reading mode.

As can be deduced from the above description, the updating (in other words, the incrementing of the content by one) of the counter 61 associated with the memory bank 11 containing the memory locations having even-numbered addresses always precedes the updating of the counter 62 associated with the memory bank 12 containing the memory locations having odd-numbered addresses.

It should be noted that the sequential reading can be carried out by decreasing the content of the counters after each reading, instead of incrementing it: in this case, a sequential reading will be carried out on an initial location and on all the locations which precede the initial location in the address space. Theoretically, it is not even necessary for the purposes of the invention that the scanning should take place at following or preceding locations adjacent to each other in the address space; this is because it is possible to envisage a reading mode requiring sequential access to locations separated by locations whose content is not to be read.

The addressing structure described is compatible with a conventional use of the memory with random access. In fact, the microprocessor simply has to keep the signal ALE constantly activated (ALE="1"): in this case, the two counters 61, 62 always have the same content, and therefore point to two corresponding dual memory locations having the address part ADD<1–15> in common. The selection of the memory location whose content is to be displayed, in other words the selection of the memory bank, is carried out according to the status of the least significant bit ADD<0> of the address.

The addressing structure according to the present invention is advantageous in many respects.

It can be seen in FIG. 7 that the sequential reading cycles have a shorter duration than the reading cycles where addresses are set externally. This is clearly an advantage. Moreover, because of the architecture according to the invention which permits interlaced reading from two memory banks, the duration of a sequential reading cycle is reduced further by comparison with conventional sequential reading.

An advantage of the memory shown in FIG. 1 is provided by the independence of the two memory banks. This is due to the presence of two counters, one for each memory bank, which supply two separate circuit systems for decoding the address and selecting the memory locations in each of the two banks, including, where present, autonomous control of the redundant rows or columns for each of the two banks.

In the case of memories of the advanced type, in which two or more memory banks are already provided, with counters controlled by the Modify and Verify functions, the counters, after being suitably modified and provided with the described controlled structures, can advantageously be used for the implementation of the present invention, thus providing these memories with additional functionality.

Clearly, although the description provided has referred to a memory organized in two memory banks, the present invention can immediately be extended to memories with any number of memory banks, by providing for each one a corresponding scanning circuit with its own counter, corresponding circuits for decoding and selecting the locations, and corresponding reading circuits. For example, it is possible to provide four memory banks which can be selected by means of a combination of two of the external addressing signals ADD (for example ADD<0> and ADD<1>), in such a way that the sequential reading takes place in interlaced mode with access to all four banks.

The present invention can be applied in any type of memory, whether volatile or non-volatile. In the particular case of non-volatile memories, the invention can be applied not only to flash memories but also to ROM, EPROM and EEPROM memories.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. Internal addressing structure for a semiconductor memory having at least two memory banks, comprising:
   a plurality of counters, each associated for operation with a corresponding one of the memory banks and capable of generating sequences of digital codes for addressing locations of the corresponding memory bank;
   first circuit means for selectively updating the counters;
   second circuit means for loading into the counters a common initial digital code, part of an initial address supplied from the outside to the memory through an address line bus, corresponding to an initial memory location; and
   third circuit means capable of detecting a first signal, supplied to the memory from the outside and indicating the presence of a digital code on the bus, to cause the common initial digital code to be loaded into the counters; and
   the first circuit means being capable of identifying, on the basis of the initial address, the bank to which the initial memory location belongs, and of consequently causing the periodic updating of the counters in a sequence which depends on the bank to which the initial memory location belongs, in such a way that successive memory locations preceding or following the initial location are addressed in sequence, each of these successive locations belonging to a corresponding memory bank, according to an interlaced system.

2. Addressing structure according to claim 1, in which the first circuit means comprise:
   fourth circuit means capable of generating a pulsed digital signal and, for each of the counters, a respective signal for conditional incrementing or decreasing; and
   fifth circuit means which are capable of determining, on the basis of the initial address, the bank to which the initial memory location belongs, and which receive the pulsed digital signal to determine, according to the bank to which the initial memory location belongs, the sequence of periodic updating of the counters, the fifth circuit means supplying enabling signals to the fourth circuit means for the sequential enabling of the conditional incrementing or decreasing signals.

3. Addressing structure according to claim 2, in which the fifth circuit means determine the bank to which the initial memory location belongs according to the status of at least one bit of the initial address.

4. Addressing structure according to claim 3, in which the at least one bit is a least significant bit of the initial address.

5. Addressing structure according to claim 4, in which each counter is associated with corresponding decoding and selection circuits for decoding the digital code generated by the counter, and for selecting the corresponding memory location in the corresponding memory bank.

6. Addressing structure according to claim 5, in which the third circuit means for detection carry out a filtering of the first signal, in such a way as to prevent spurious loading into the counters.

7. Addressing structure according to claim 6, in which the third circuit means comprise a register which can be activated selectively for the temporary loading of the common initial digital code, and switch means which can be activated selectively to supply the common initial digital code, temporarily loaded into the register, to the counters, where the register and the switch means are controlled by respective signals generated by the filtering of the first signal.

8. Addressing structure according to claim 7, in which, if the first signal is held constantly at a specified logical level, the counters are always loaded with the same digital code forming part of an address currently supplied to the memory from the outside, the selection of the memory bank to which the addressed memory location belongs being carried out according to the status of the at least one bit of the address currently supplied to the memory from the outside.

9. Addressing structure according to claim 1, wherein the structure comprises two memory banks, a first memory bank containing even-numbered address locations, and a second memory bank containing odd-numbered address locations, in which the selective updating of the counter associated with the first memory bank always precedes the selective updating of the counter associated with the second memory bank.

10. Addressing structure according to claim 1, in which the counters are of the "ripple" type.

11. Addressing structure according to claim 10, in which stages of each counter are grouped in groups, and the counter is associated with a corresponding network for propagating a carry signal between groups of adjacent stages.

12. Addressing structure according to claim 11, comprising switch means which can be activated selectively in a memory monitoring mode to make available, on a corresponding externally accessible terminal of the memory, an output of the carry signal propagation networks associated with each counter.

13. Addressing structure according to claim 12, in which, in the monitoring mode, the corresponding externally accessible terminal of the memory is monitored to identify malfunctions of the corresponding counter.

14. Addressing structure according to claim 1, comprising, for each memory bank, circuits connected for operation to the corresponding counter for recognizing an address corresponding to a defective memory location in the memory bank and for selecting, as a substitute, a redundant memory location in the memory bank.

15. A semiconductor memory, comprising:
   first and second memory banks;
   first and second addressing circuits coupled to the first and second memory banks, respectively;
   first and second counters respectively coupled to the first and second memory banks via the first and second addressing circuits, respectively, the first counter storing and outputting a first address that causes the first addressing circuit to access an initial memory location in the first memory bank corresponding to the first address, the second counter storing and outputting a second address that causes the second addressing circuit to access an initial memory location in the second memory bank corresponding to the second address; and
   an increment generator coupled to the counters, the increment generator being structured to alternately increment the first and second addresses in the first and second counters, respectively, in such a way that successive memory locations preceding or following the said initial memory locations are addressed in sequence, in an interlaced manner.

16. The semiconductor memory of claim 15, further comprising an increment enable circuit coupled to the increment generator, the increment enable circuit being structured to trigger the increment generator into increment either the first counter or the second counter based a value of an external address bit.

17. The semiconductor memory of claim 15, further comprising a counter enable circuit coupled to the counters and structured to receive an address latch enable signal and, in response, enable the first and second counters to load and store the first and second addresses.

18. A method, comprising:
   receiving an address into a first counter, the first counter being associated with a first memory bank;
   receiving the address into a second counter, the second counter being associated with a second memory bank;
   retrieving a byte of data from a location in the first memory bank associated with the address in the first counter;
   incrementing the address in the first counter,
   retrieving a byte of data from a location in the second memory bank associated with the address in the second counter; and
   incrementing the address in the second counter.

19. The method of claim 18, wherein the steps of retrieving the byte of data from the first memory bank and incrementing the address in the second counter are performed concurrently, and the steps of retrieving the byte of data from the second memory bank and incrementing the address in the first counter are performed concurrently.

20. The method of claim 18, wherein the address received into the counters is a binary number.

21. The method of claim 20, wherein the incrementing steps comprise adding a single digit to the binary number.

22. The method of claim 20, wherein the incrementing steps comprise subtracting a single digit from the binary number.

23. The method of claim 20, wherein the address received into the counters is an address received from an external device, from which the least significant bit has been removed.

24. The method of claim 23, wherein if the least significant bit is a 1, the step of incrementing the address in the first counter is performed before the step of retrieving the byte of data from the first memory bank.

25. The method of claim 18, wherein the retrieving steps and the incrementing steps are repeated until an interrupt signal is received.

* * * * *